United States Patent [19]
Suzuki et al.

[11] Patent Number: 5,135,730
[45] Date of Patent: Aug. 4, 1992

[54] METHOD AND APPARATUS FOR SYNTHESIZING DIAMOND BY COMBUSTION

[75] Inventors: Tomio Suzuki; Yoshiaki Morinishi, both of Kobe, Japan

[73] Assignee: Kabushiki Kaisha Kobe Seiko Sho, Kobe, Japan

[21] Appl. No.: 675,953

[22] Filed: Mar. 27, 1991

[30] Foreign Application Priority Data

| Mar. 28, 1990 | [JP] | Japan | 2-82570 |
| Apr. 23, 1990 | [JP] | Japan | 2-43657[U] |
| Apr. 25, 1990 | [JP] | Japan | 2-111263 |
| Aug. 1, 1990 | [JP] | Japan | 2-82309[U] |
| Aug. 1, 1990 | [JP] | Japan | 2-205412 |
| Aug. 1, 1990 | [JP] | Japan | 2-205413 |
| Sep. 13, 1990 | [JP] | Japan | 2-244503 |

[51] Int. Cl.$^5$ .............................. C01B 31/06
[52] U.S. Cl. .................................. 423/446
[58] Field of Search ........................ 423/446

[56] References Cited

FOREIGN PATENT DOCUMENTS

| 324538 | 7/1989 | European Pat. Off. |
| 379994 | 8/1990 | European Pat. Off. |
| 62-21793 | 1/1987 | Japan ............ 423/446 |
| 1-167211 | 6/1989 | Japan ............ 423/446 |

Primary Examiner—Michael Lewis
Assistant Examiner—Stuart L. Hendrickson
Attorney, Agent, or Firm—Oblon, Spivak, McClelland, Maier & Neustadt

[57] ABSTRACT

A process for synthesizing diamond by combustion includes the steps of mixing a hydrocarbon fuel gas and oxygen, burning the mixed gas with a burner, contacting the resulting flame with a surface of a substrate provided in face-to-face relation with the burner, and cooling the substrate to synthesize the diamond. The diamond synthesizing conditions on the surface of the substrate are controlled so as to lower the growth rate.

8 Claims, 12 Drawing Sheets

F I G. 5
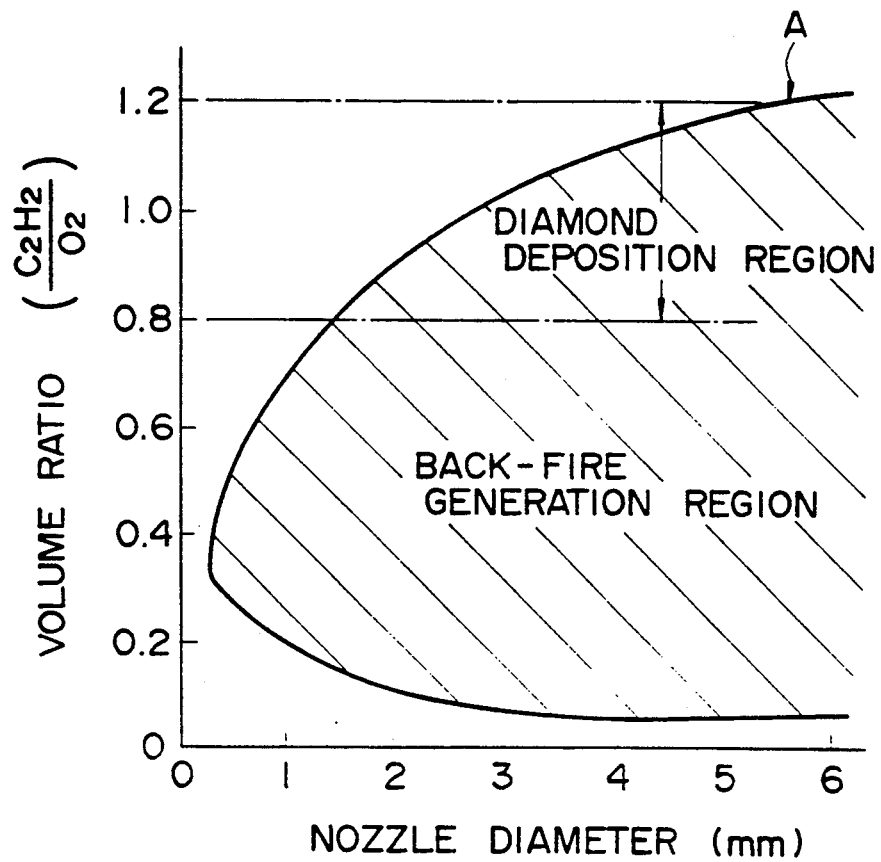

METHOD AND APPARATUS FOR SYNTHESIZING DIAMOND BY COMBUSTION

BACKGROUND OF THE INVENTION

1. Field of the Invention

This invention relates to a process for synthesizing diamond by a combustion technique and more particularly to a process for synthesizing diamond by burning a hydrocarbon fuel gas and an oxidizing agent with a burner and directing the combustion flame against a surface of a substrate provided in face-to-face relation with the burner to form diamond on the substrate surface. The invention also relates to an synthesizing apparatus of diamond which is useful for synthesis of diamond.

2. Description of the Prior Art

Broadly, synthesizing methods of artificial diamond include a high pressure and high temperature synthesizing process and a low pressure vapor phase synthesizing process. In recent years, there has been proposed, as one of the lower pressure vapor phase synthesizing processes, a process of synthesizing diamond by a so-called combustion technique using a combustion flame. The working principal of this process is illustrated with reference to FIG. 2. As shown in the figure, hydrocarbon-based fuels such as, for example, acetylene, ethylene, methane, propane, methanol, ethanol and the like are provided as a carbon source for deposition of diamond. The fuel is subjected to combustion by means of a burner 11 along with pure oxygen serving as an oxidizing agent, which is used in an amount far smaller than the theoretical mixing ratio. By this, a flame 14 called feather is produced in a flame 12 obtained under such combustion conditions as mentioned above in the vicinity of a nozzle 13. When a substrate 15 is placed in the flame 14 and is forced to cool by a cooling means of a substrate holder 16 while keeping the substrate temperature at 300° to 1200° C., diamond is synthesized on the surface of the substrate 15.

Most of the diamond synthesizing processes hitherto proposed up to now are based on fundamental experiments wherein the burner 11 used in the synthesizing apparatus is, in most cases, commercially available cutting or welding torches. However, the injection port of the nozzle of these torches is a single port with a relatively small size. In this condition, even if the substrate 15 is optimumly provided, an area on which diamond is to be synthesized becomes very small is limited to 3 to 5 times the size of the injection port. The diameter of the injection port of commercially available burners is about 3 mm in maximum. Accordingly, the deposition area is only that of about 15 mm in diameter in maximum. Thus, the diamond synthesizing process using the combustion technique has the problem that when compared with chemical vapor deposition method (which may be hereinafter referred to as CVD methods) ordinarily used as one of diamond synthesizing processes, the area of synthesized diamond is smaller.

In general, cutting or welding torches have such a structure that a fuel and an oxidizing agent are mixed fairly upstream of an outlet of the injection port. In addition, the deposition time in combustion technique has to be continued over several hours and the substrate temperature has to be kept at high levels, so that the nozzle and its neighbours are exposed to a high temperature atmosphere and subjected to red heat, with a tendency toward back fire. This may lead to explosion accidents or damages by burning out of the torch.

On the other hand, in the above-described diamond synthesizing processes, it is one of very important factors for the synthesis of diamond to maintain the substrate 15 at a temperature of from 300° to 1200° C. The substrate is usually cooled either by a water-cooled pipe structure of the substrate holder 16 wherein water is passed through the pipe, or by a method wherein a cooling medium such as cooling water or a cooling gas is directly injected against the back of the substrate 15 mounted on the substrate holder 16. However, such a cooling structure or method is not effective in accurately controlling the temperature of the substrate 15, making it difficult to synthesize diamond with a good quality and/or a large size. Especially, with the latter cooling method, cooling water or a cooling gas is directly blown against the back of the substrate 15, so that the combustion flame is distrubed, with the problem that the diamond synthesis cannot be efficiently performed.

We made many attempts to synthesize diamond as one of studies of synthesizing diamond along with the development of diamond synthesizing apparatus. As a result, it was found that the diamond synthesizing process using the combustion technique is an economical method among low pressure vapor phase processes but it was very difficult to synthesize diamond with a large crystal size on the surface of the substrate. More particularly, the crystal growth is disturbed at the time when the crystal size reaches approximately 100 to 300 μm. A longer deposition time results in commencement of deposition of graphite or carbon on the crystal surfaces. Thus, diamond with a larger crystal size cannot be synthesized.

OBJECTS OF THE INVENTION

It is accordingly an object of the invention to provide a process for synthesizing diamond with a larger crystal size in an economical manner wherein a diamond synthesizing process using a combustion technique is improved.

It is another object of the invention to provide a diamond synthesizing apparatus wherein a large area of synthesized diamond can be obtained and which includes a burner which is unlikely to undergo back-fire.

It is a further object of the invention to provide a synthesizing apparatus having a cooling mechanism for a substrate which ensures a substrate temperature to be accurately controlled in an appropriate temperature range of from 300° to 1200° C.

BRIEF DESCRIPTION OF THE DRAWINGS

FIG. 5 is a graphical view showing the region of the back-fire and the diamond synthesis in the relation between the ratio by volume of acetylene and pure oxygen ($C_2H_2/O_2$) and the opening or port size of nozzle;

SUMMARY OF THE INVENTION

Figure 1:
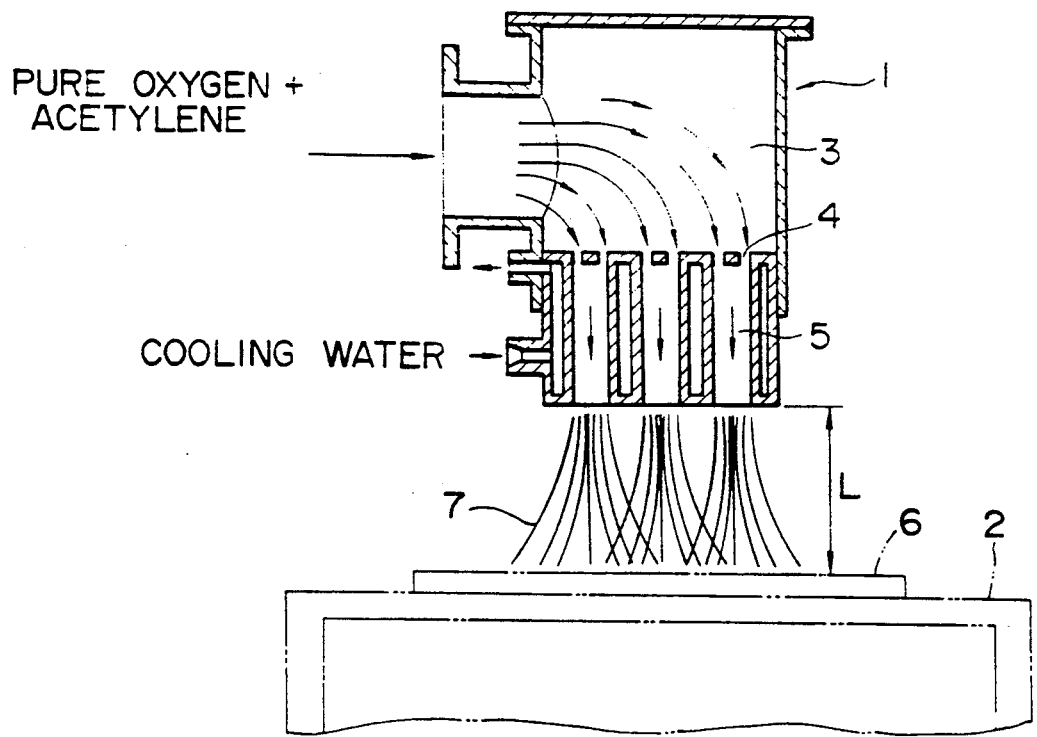
FIG. 1 is a schematic view showing an arrangement of an apparatus for carrying out a diamond synthesizing process of the invention.
Figure 2:
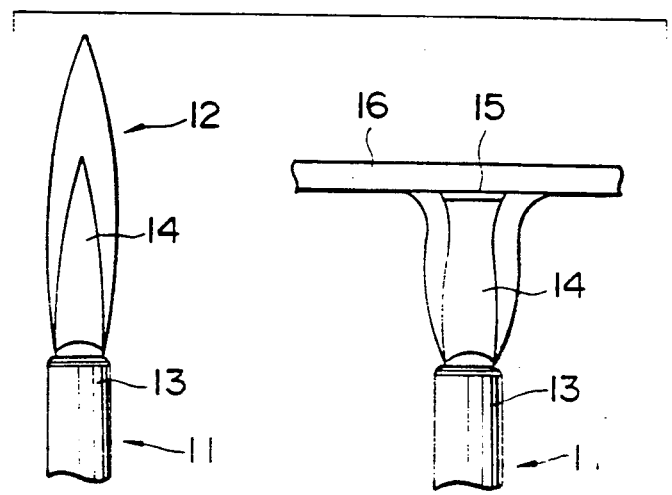
FIG. 2 is a schematic view illustrating the principle of a diamond synthesizing process using a combustion technique.

In order to achieve the above objects, there is provided a diamond synthesizing process which comprises burning a hydrocarbon fuel gas with a burner, and contacting the resulting combustion flame with a substrate surface provided in face-to-face relation with the burner while cooling the substrate to deposit diamond on the substrate surface, characterized in that as a time passes after commencement of the synthesis of diamond, synthesizing and reacting conditions of diamond on the substrate surface are so controlled as to intermittently or continuously create the lower diamond growth rate conditions.

In order to control the diamond synthesizing conditions toward the lower growth rate, the distance between the tip of a burner and the surface of a substrate may be increased as time passes after commencement of the synthesis.

Alternatively, such a control may be achieved in such a way that the mixing ratio by volume of oxygen and a hydrocarbon fuel gas (oxygen/hydrocarbon fuel) is increased as time passes after commencement of the synthesis. By this, the above objects of the invention can be attained.

Still alternatively, the control of the diamond synthesizing conditions toward the lower growth rate may also be achieved by controlling a crystal surface temperature of diamond, in a diamond synthesizing process using a combustion technique, to a lower level as time passes after commencement of the synthesis. For controlling the crystal surface temperature of diamond to a lower level after time passes after commencement of the synthesis, there may be mentioned a procedure wherein an inert gas is mixed with the fuel gas so that the content of the inert gas is increased as time passes. Alternatively, it may be effective to increase the cooling ability of the cooling mechanism against the substrate. By this, the crystal surface temperature of diamond can be appropriately controlled, thereby obtaining diamond with an intended crystal size.

The diamond synthesizing apparatus of the invention which is useful for carrying out the process of the invention and wherein a combustion flame is contacted with a substrate surface to deposit diamond on the substrate surface is of the type which comprises a burner for burning a mixture of a hydrocarbon fuel gas and oxygen, the burner arranged to contact the resulting combustion flame with a substrate surface provided in face-to-face relation with the burner, and a cooling mechanism provided in contact with the substrate, characterized in that the burner of the apparatus has at a tip thereof a nozzle portion having a plurality of injection ports or openings, a cylindrical burner body which has upper and lower chambers divided with a partition wall, and a plurality of pipes each provided through the partition wall, opened to the upper chamber at end portion thereof and directed toward the injection port of the nozzle portion at the tip thereof, the upper and lower chambers having, respectively, a gas introduction port for combustion, the plurality of pipes having, respectively, a plurality of small holes made through pipe walls at the tip portions thereof. When the nozzle portion of the synthesizing apparatus is arranged to have a water-cooling structure, back-fire can be effectively prevented.

The burner body of the diamond synthesizing apparatus which has a nozzle portion at the tip thereof with a plurality of injection ports and a water-cooling structure should preferably be designed to have a diameter of the respective injection ports of not larger than 5 mm and a distance between adjacent injection ports of not larger than 20 mm.

An optimum arrangement of the cooling mechanism of the diamond synthesizing apparatus according to the invention includes a cooling box which has a wall at one side contacting the back side of the substrate and which is provided with a cooling medium feed pipe and a discharge pipe in such a way that the feed pipe in the inside of the cooling box has an injection port arranged in face-to-face relation with the inner face of the one side wall. Preferably, the injection portion of the feed pipe should be designed to be removable. By this, the degree of injection of the cooling medium against the inner surface can be controlled to adjust the cooling ability. Moreover, the apparatus should preferably have, as a means for measuring the temperature of substrate, thermometers whose sensor portions are, respectively, embedded at a contacting side and an inner side of the wall at the one side. Alternatively, the substrate temperature may be measured by making a hole at the central portion of the wall at the one side and providing a temperature detector whose sensor portion reaches the back side of the substrate.

DETAILED DESCRIPTION OF THE INVENTION

Reference is now made to the accompanying drawings and particularly to FIG. 1. FIG. 1 is a schematic view of an apparatus used to carry out a diamond synthesizing process of the invention. In the figure, there are generally indicated a burner 1 and a substrate holder 2.

The burner 1 is of the type wherein a fuel and an oxidizing agent are pre-mixed and burnt. More particularly, a fuel and an oxidizing agent are pre-mixed and fed to injection ports 5 through a mixing chamber 3 and a back-fire preventive plate 4. The preventive plate 4 is arranged to have the function of uniform distribution of the flow to the respective injection ports 5.

The substrate holder 2 has a flat upper surface on which a substrate 6 on which diamond is to be synthesized is mounted and is arranged to be cooled with a cooling device as described hereinafter. In the figure, indicated by 7 is a combustion flame and by L is a distance between the tip of the burner 1 and the surface of the substrate 6.

Using the apparatus shown in FIG. 1, we made a test to check the relation between the distance, L, between the tip of the substrate surface and the growth rate of diamond. The test was conducted using acetylene as a fuel and pure oxygen as an oxidizing agent under conditions of a ratio by volume of pure oxygen and acetylene of 0.9 to 1.1:1 and a total flow rate of both pure oxygen and acetylene of 0.2 Nm$^3$/hour per unit injection port of the burner. In addition, the substrate 6 was cooled by feeding water to the substrate holder 2 and also by feeding air. The deposition time was one hour. The results of the test are shown in FIG. 3.

Figure 3:
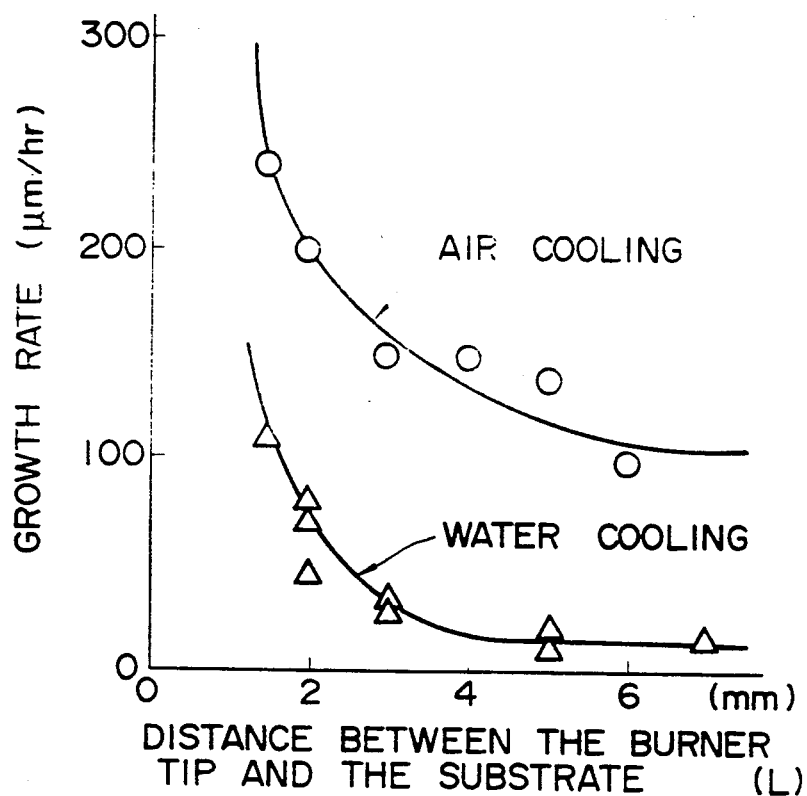
FIG. 3 is a graphical representation of the distance, L, between the tip of a burner and the substrate surface in relation to the diamond growth rate for different modes of cooling.

As will be apparent from FIG. 3, the growth rate of diamond increases with a decrease of the distance, L. The rate of 100 μm/hour or over was found to be possible, which is several tens to several hundreds times greater than that attained by a known plasma CVD process. The growth rate of diamond becomes higher for the air cooling than for water cooling. The reason for this is considered as follows: with the air cooling, the surface temperature of the substrate 6 could be controlled at a higher level within an appropriate temperature range of from 300° to 1200° C. for the synthesis of diamond.

Figure 4:
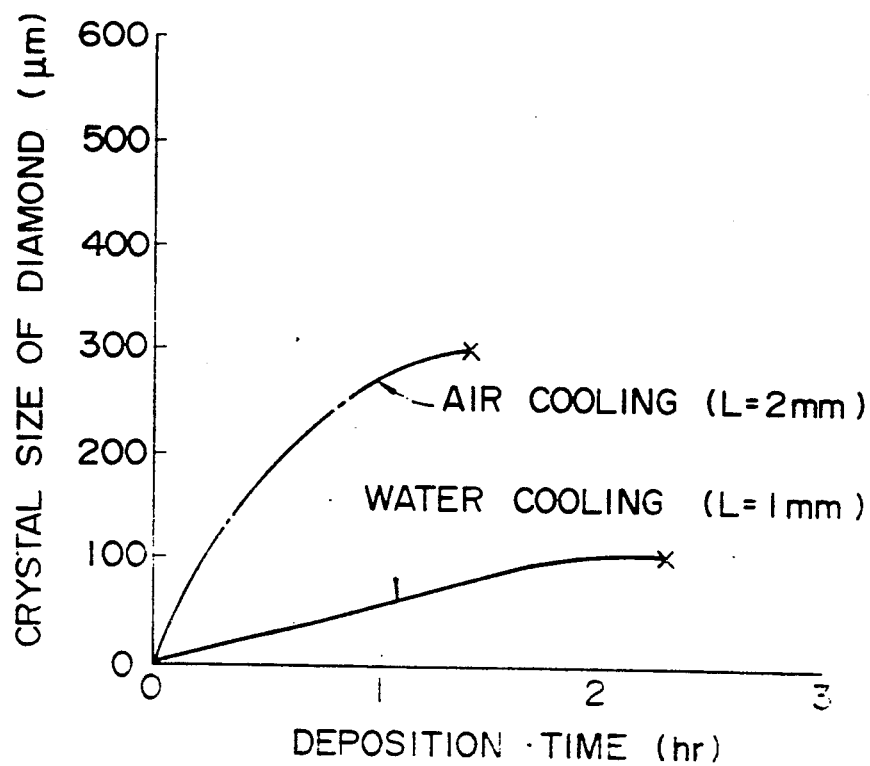
FIG. 4 is a graph showing the relation between the deposition time and the diameter of diamond particles.

However, it was found that when diamond was synthesized over a long time while keeping the distance, L, small and constant, limitation was placed on the size of the resultant particles. More particularly, as shown in FIG. 4, when the substrate 6 was so kept that the distance, L, was 1 mm and was cooled with water, the growth rate of diamond was low since the temperature of the substrate 6 could not be increased. It was also found that the synthesis over two hours and fifteen minutes resulted in deposition of graphite and carbon on the crystal surface, thus making it impossible to synthesize diamond. On the other hand, when the substrate 6 was kept so that the distance, L, was 2 mm and was air cooled, the temperature of the substrate could be elevated, leading to a high growth rate of diamond and the growth of diamond to a crystal particle size of about 300 μm. However, as in the case of the water cooling, the synthesis for 1.5 hours or over resulted in deposition of graphite and carbon on the crystal surface. Thus, diamond could not be synthesized.

Many reasons for which diamond could not be synthesized are considered.

One of the reasons is that the growth of diamond has relation with the surface temperature of the substrate and the carbon-based intermediate products such as CH, C$_2$H, CH$_2$ and the like. More particularly, where the distance, L, between the tip of the burner and the substrate surface is small as shown in FIG. 3, carbon-based intermediate products are present in the vicinity of the substrate surface in large amounts. At the initial stage of the synthesis, these products contribute to the deposition of diamond and have the ability of synthesizing and building up diamond on the substrate (a kind of absorbability). At the same time, the surface temperature of diamond increases, so that the carbon-based intermediate products are converted to graphite and carbon.

We made a further test to determine conditions of synthesizing diamond which overcome the above disadvantage and by which a larger crystal size is obtained.

In the diamond synthesizing process using a combustion technique, the flame from a burner invariably involves greatly varying distributions of temperature and gas concentration along a direction of axis of the burner (the flow direction of a flame) since the combustion proceeds along the direction of axis of the burner. If the substrate is placed parallel to the flow direction of the flame to synthesize diamond, synthesizing condition of diamond may be outside those conditions since the temperature distribution on the substrate surface and the gas concentration distribution in the vicinity of the surface are greatly varied. Moreover, if diamond is deposited on the substrate surface at a portion upstream of the flame, little problem arises in case where such diamond is in the form of fine particles. If large-sized particles are formed, the flow of the flame is impeded, so that the temperature and the gas concentration in a downstream region are disturbed. In this case, the synthesizing conditions of diamond may be outside intended ranges.

In order to minimize the temperature distribution of the substrate surface and the gas concentration distribution therearound, we have attempted to arrange the substrate surface vertical to an axial center of the burner. While the substrate surface is provided in a manner vertical to the axial center of the burner, the distance between the tip of the burner and the substrate surface is kept as small as possible (e.g. not larger than 5 mm) at the time of commencement of the synthesis. As time passes after the commencement of the synthesis, the distance is increased to lower the surface temperature of the substrate, i.e. if L is changed from 1 mm to 2 mm, a decrease of the temperature is about 50° C. At the same time, the amount of carbon-based intermediate products is suppressed to stably deposit diamond. By this, it has been found that diamond with a larger crystal size can be synthesized.

Then, we have investigated another measure for suppressing formation of graphite and/or carbon by reducing the amount of carbon-based intermediate products in the vicinity of the substrate surface at the time of commencement of the synthesis. As a result, it has been found that the suppression can be achieved by increasing a mixing ratio by volume of oxygen and a starting hydrocarbon fuel gas (oxygen/hydrocarbon fuel) as time passes after the commencement of the synthesis.

Another reason why graphite and/or carbon is deposited on the crystal surface and diamond with a large crystal size cannot be synthesized is considered as follows. The crystals of diamond synthesized on the substrate are formed on the substrate wherein the surface temperature is thermally balanced with respect to heat input and heat output. It is considered that the heat input relies on the convection from the flame and the heat transmission by radiation and the heat output relies on removal of heat from the lower portion of the crystals through cooling of the substrate. The heat balance on the crystal surface varies as time passes and the crystal size increases. When the crystal size reaches approximately 150 to 300 μm as stated before, the amount of heat input to the crystals becomes greater than the amount of heat output through the substrate. As a result, the crystal surface temperature will be outside the range of 300° to 1200° C. which is appropriate for the synthesis of diamond and is in a high temperature range where diamond is degraded.

In view of the above, we have found that in order to synthesize diamond with a large crystal size, it is necessary to control the temperature on the crystal surface of diamond synthesized on the substrate. In this connection, however, it will be almost impossible to measure the surface temperature of crystals which grow only in one hundred to several hundreds μm per hour. It occurred to us that when the temperature of crystal surfaces of diamond synthesize on the substrate is controlled as a function of synthesizing time by controlling the heat input or heat output in such a way that the temperature is lowered with a passage of the deposition time. For controlling the crystal surface temperature in relation to the time, it has been found that an inert gas may be so mixed with a fuel gas for the burner that its content is increased as time passes. Alternatively, the crystal surface temperature may also be controlled by increasing the cooling ability on the substrate with an increase of deposition time after commencement of the synthesis. The arrangement of a cooling device for cooling the substrate will be described in detail in examples appearing hereinafter.

The above manners of the control may be effective when they are preformed separately. More precise control will become possible when the controls are used in combination with the expectation that larger-sized diamond with good crystallinity can be synthesized.

The above-described diamond synthesizing procedures are within the same scope with respect to the fact that diamond synthesizing and reacting conditions are so controlled as to intermittently or continuously vary to the lower growth rate conditions as time passes after commencement of the synthesis.

The diamond synthesizing apparatus of the invention is described. As stated before, the burner of the synthesizing apparatus of the invention includes a nozzle portion having a plurality of injection ports. The nozzle face is made wide, so that diamond can be formed uniform over a wide zone on the surface of the substrate by means of feathers produced from individual injection ports. In addition, the burner body of a cylindrical form has a partition wall in the inside thereof to divide the body into two chambers. The two chambers have, respectively, a fuel feed chamber and an oxygen feed chamber. A plurality of pipes are provided through the partition wall so that each pipe is opened to the fuel feed chamber at a rear end thereof and is passed through the oxygen feed chamber toward an injection port at the tip thereof. In this state, when a fuel is fed to one of the chamber and an oxidizing agent (oxygen) is fed to the other chamber, mixing of the fuel and the oxidizing agent is made in the vicinity of an inlet of the injection portion of the nozzle portion or on the way to the outlet of the injection port. Accordingly, back-fire can almost be prevented. Even if back-fire occurs, the occurrence is only in the vicinity of the inlet of the injection portion without any fear of leading to troubles. Since the plurality of pipes have, respectively, a plurality of small holes at the pipe walls of the tip portion thereof, the fuel or oxidizing agent passing through these small holes is injected as crossing the flow of the oxidizing agent or fuel. Thus, mixing of the fuel and the oxidizing agent is facilitated, ensuring the mixing in molecular states. In order to attain such a mixing mode, the small holes should preferably be relatively large in number with a relatively small size of each hole. For effectively preventing the back-fire, the nozzle portion should preferably have a water-cooling structure or unit.

In particular, the burner body having a plurality of injection ports and a water-cooling structure at the tip of the nozzle portion should preferably be designed as follows. The injection ports of the nozzle portion have a size of not larger than 5 mm, preferably from 2 to 5 mm. This is because if the port size is larger than 5 mm, back-fire is liable to take place. When combustion is made so as to prevent the back-fire, there is not obtained a flame which is necessary for synthesizing diamond. As set forth before, the area on which diamond is synthesized from a single port of the nozzle is limited to a range of 3 to 5 times the diameter of the port. If the port size is smaller than 2 mm, the distance between adjacent injection ports has to be made very small so as to obtain diamond of a uniform quality. This will lead to a complicated structure of the nozzle portion including a water-cooling structure, thus being not favorable from the practical standpoint. The distance between adjacent injection ports made in the nozzle portion is not larger than 20 mm, preferably from 10 to 20 mm. When the distance is over 20 mm, uniform synthesis of diamond undesirably requires a port size over 5 mm, thus presenting a problem as with the case where the port size is over 5 mm. On the other hand, when the distance is smaller than 10 mm, no problem is involved in the case where the port size is small. However, when the port is made a relatively large in size, the water-cooling structure is difficult to attach to the nozzle portion, thus making it difficult to cool the nozzle portion to a satisfactory extent. In some case, there may arise the problem of back-fire.

We made a test wherein a commercially available welding torch was used, the port size of a nozzle was changed in the range of up to 6 mm, and acetylene and pure oxygen were pre-mixed in the range of the ratio by volume of up to 1.2 ($C_2H_2/O_2$) and burnt, thereby checking a state of back-fire and a synthetic condition of diamond. The results are shown in FIG. 5. In the figure, the ordinate indicates the ratio by volume of pure oxygen and acetylene ($C_2H_2/O_2$) and the abscissa indicates a port size of the nozzle. Curve A in the figure is a boundary line at which back-fire takes place (the shaded region is a range where back-fire occurs). The results of the test reveal that the ratio by volume of pure oxygen and acetylene at which diamond can be synthesized is limited to a range of from 0.8 to 1.2:1. When the port size is within a range of from 1.5 to 5 mm, diamond can be reliably synthesized with little problem involved with respect to the back-fire.

The cooling mechanism of the synthesizing apparatus of the invention is just as described hereinabove. More particularly, the injection ports of the feed pipes for a cooling medium within the cooling box which has been illustrated as the substrate holder are provided in face-to-face relation with one inner face at one side contacting the back side of the substrate, so that the flame from the burner is not disturbed thereby effectively cooling the substrate. In the above cooling mechanism, the injection ports may be provided removably with respect to the inner face at the one side, by which the substrate temperature can be accurately controlled within a range of from 300° to 1200° C. When sensor portions are, respectively, embedded at a contacting side and an inner face of the wall at the one side, more accurate measurement of the substrate temperature is ensured. Alternatively, the substrate temperature may be measured by making a hole at the central portion of the wall at the one side and providing a temperature detector whose sensor portion reaches the back side of the substrate.

The cooling medium used in the apparatus of the invention may be either gaseous or liquid. The gases used as the medium include, for example, air, nitrogen, argon, helium and the like, and the liquids include, for example, water.

The present invention is more particularly described by way of examples.

EXAMPLE 1

Diamond was synthesized using the apparatus shown in FIG. 1 and acetylene as a fuel and oxygen as an oxidizing agent under conditions of a ratio by volume of pure oxygen/acetylene of 0.9 to 1.1:1 and a total flow rate of the acetylene and pure oxygen of 0.2 $Nm^3$/hour per unit injection port. A substrate was cooled by feeding air to the substrate holder. Under these conditions, the distance, L, between the tip of the burner and the substrate surface was kept during a time of from commencement of the synthesis till about 30 minutes at 1 mm at which the growth rate of diamond was great. Thereafter, the distance was adjusted to 2 mm and one hour after the commencement, the distance was adjusted to 7 mm, thereby forming diamond on the substrate. The synthesis was continued over 2 hours to form diamond with a crystal size of about 500 $\mu$m.

Figure 6:
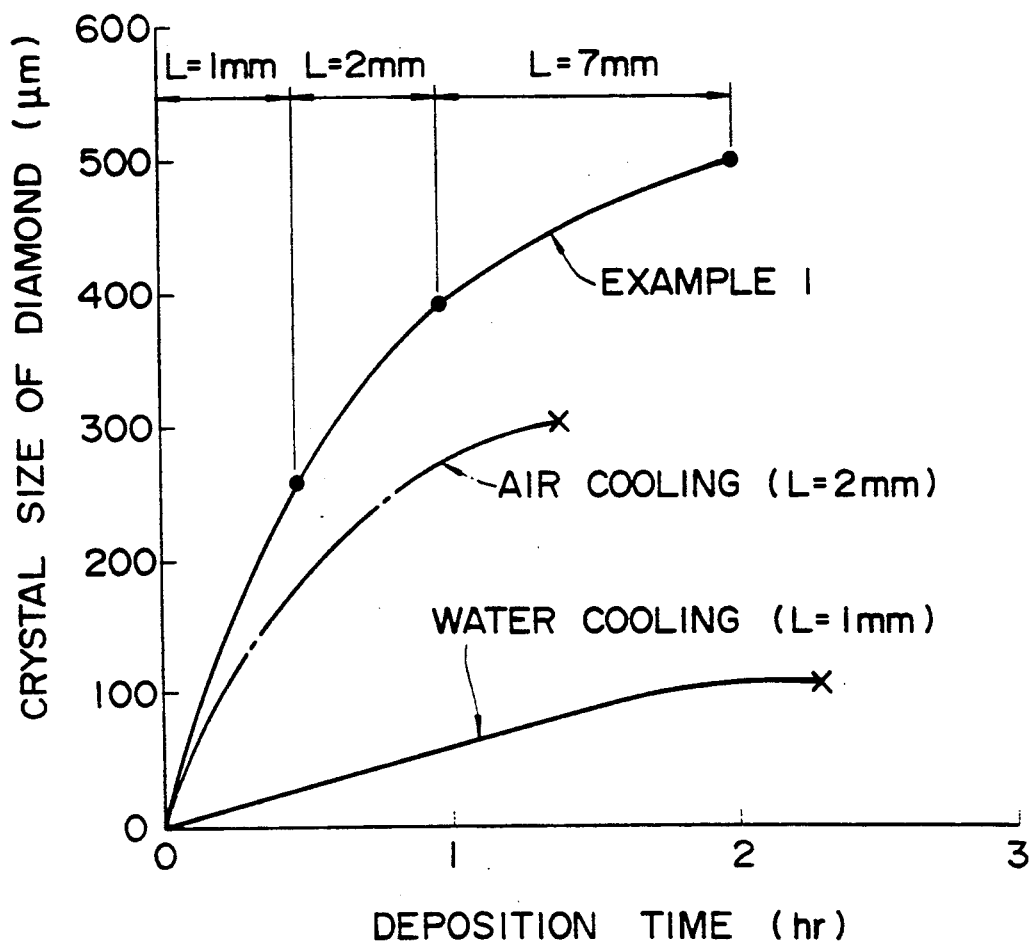
FIG. 6 is a graph showing the relation between the deposition time of diamond and the crystal size in Example 1 and prior art for comparison.

The results are shown in FIG. 6.]

EXAMPLES 2 TO 4

Diamond was synthesized using the apparatus shown in FIG. 1 wherein acetylene was used as a hydrocarbon fuel gas, a total fuel rate of the fuel gas and oxygen was set at 0.2 $Nm^3$/hour per unit injection port of the burner, air was fed to the substrate holder for cooling the substrate, and the distance, L, between the tip of the burner and the substrate surface was set at 2 mm. Under these conditions, a ratio by volume of oxygen/acetylene ($O_2/C_2H_2$) was changed in the following manner to synthesize diamond on the substrate.

In Example 2, diamond was synthesized for about 30 minutes after commencement of the synthesis at a ratio of $O_2/C_2H_2$ of 1.05 at which the growth rate of diamond was relatively great. Thereafter, the amount of oxygen was increased to a ratio of $O_2/C_2H_2$ of 1.08, under which the synthesis was continued for 2.5 hours.

In Example 3, for about 30 minutes after commencement of the synthesis, the synthesis was performed at $O_2/C_2H_2$ of 1.05 in the same manner as in Example 2. Thereafter, the amount of oxygen was increased to a ratio of $O_2/C_2H_2$ of 1.09, under which the synthesis was continued for 2.5 hours.

In Example 4, for about 30 minutes after commencement of the synthesis, the synthesis was performed at $O_2/C_2H_2$ of 1.05 in the same manner as in Example 2. Thereafter, the amount of oxygen was increased to a ratio of $O_2/C_2H_2$ of 1.10, under which the synthesis was continued for 2.5 hours.

Figure 7:
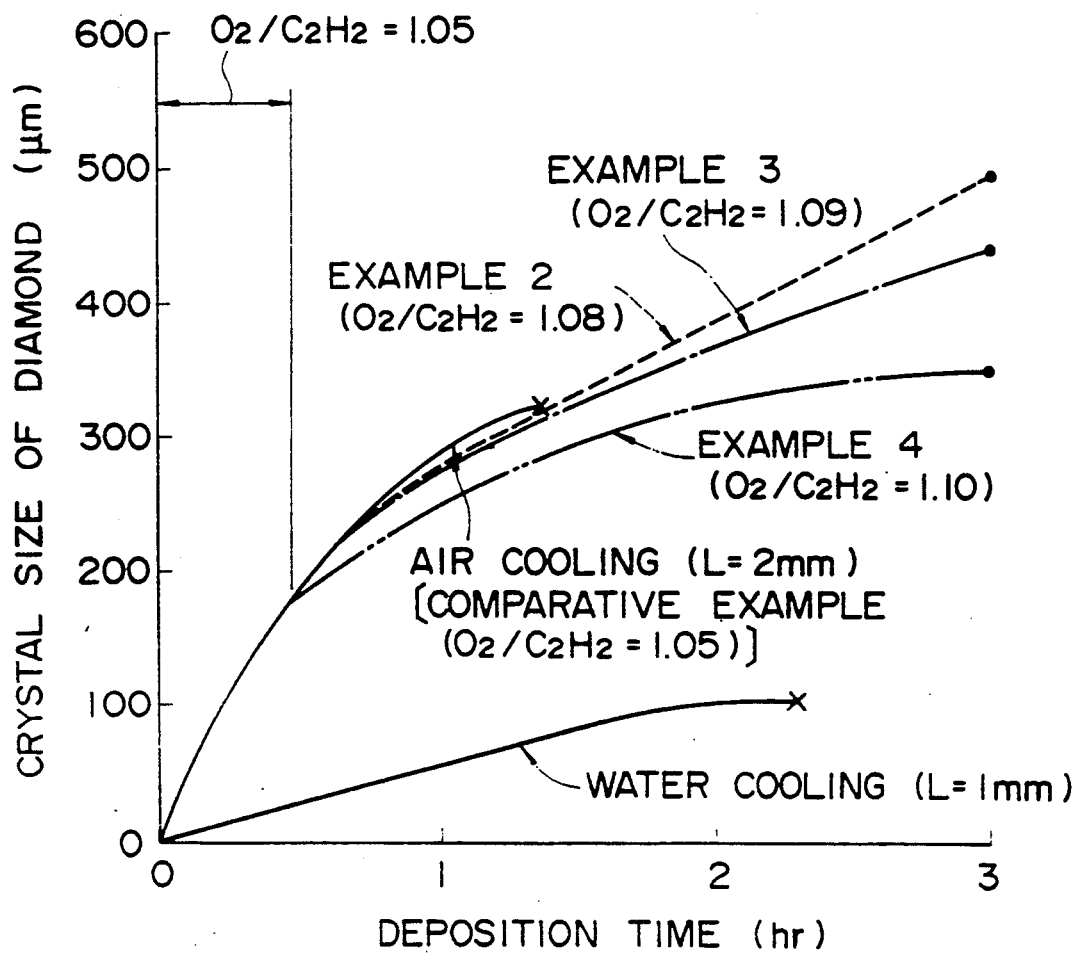
FIG. 7 is a graph showing the relation between the deposition time of diamond and the crystal size in Examples 2 to 4 and prior art for comparison.

The results of Examples 2 to 4 are shown in FIG. 7 in comparison with the case where the ratio by volume of oxygen and acetylene was set at a constant level of 1.05.

As will be apparent from FIG. 7, when the synthesis was continued at a ratio by volume of oxygen and acetylene ($O_2/C_2H_2$) of 1.05, graphite and/or carbon is deposited on the crystal surface after about 1.5 hours, making it impossible to synthesize diamond. In contrast, in Example 2 to 4, graphite and/or carbon was not deposited 3 hours after commencement of the synthesis to obtain diamond having a large crystal size. It will be noted that at the deposition time of 3 hours, diamond has a size of about 500 $\mu$m in Example 2, a size of about 450 $\mu$m in Example 3, and a size of about 350 $\mu$m in Example 4.

In the above examples, the ratio by volume of oxygen and acetylene was changed once about 30 minutes after commencement of the synthesis. As will be apparent from the above results, when the ratio by volume of oxygen and acetylene was greatly changed in relation to the initial ratio, the size of diamond synthesized at the same deposition time tends to become smaller. Accordingly, diamond with a larger size is considered to result when the ratio by volume of oxygen and a hydrocarbon fuel is increased intermittently or continuously from the time of commencement of the synthesis within a range of the ratio of 0.9 to 1.1:1, within which diamond is believed to be synthesized.

EXAMPLE 5

The apparatus of FIG. 1 was used except that a nitrogen feed pipe was connected to a fuel feed pipe (not shown) through a flow control valve, wherein the distance, L between the tip of the burner and the substrate surface was set at 2 mm, acetylene used as a fuel and pure oxygen used as an oxidizing agent were used at a ratio by volume of pure oxygen and acetylene of 0.9 to 1.1:1 at a total flow rate of the fuel and pure oxygen of 0.2 $Nm^3$/hour per unit injection port, and air was fed to the substrate holder. The synthesis was performed under the above conditions at an initial stage of the synthesis. About 30 minutes after commencement of the synthesis, the flow control valve of the nitrogen feed pipe was opened to feed nitrogen at a ratio by volume to acetylene (nitrogen/acetylene) of about 0.10. After 30 minutes, the flow control valve was further opened to feed nitrogen at a ratio by volume to nitrogen (nitrogen/acetylene) of about 0.25, thereby forming diamond on the substrate over 2 hours in total. As a result, diamond with a crystal size of about 500 $\mu$m could be synthesized by synthesis over 2 hours.

In this example, nitrogen is fed from the fuel feed pipe, but may be fed from an oxygen feed pipe. Moreover, nitrogen is used as an inert gas. Argon or its mixed gas with nitrogen is preferably used.

EXAMPLE 6

Diamond was synthesized by the use of a synthesizing apparatus using a combination of the apparatus of FIG.

Figure 8:
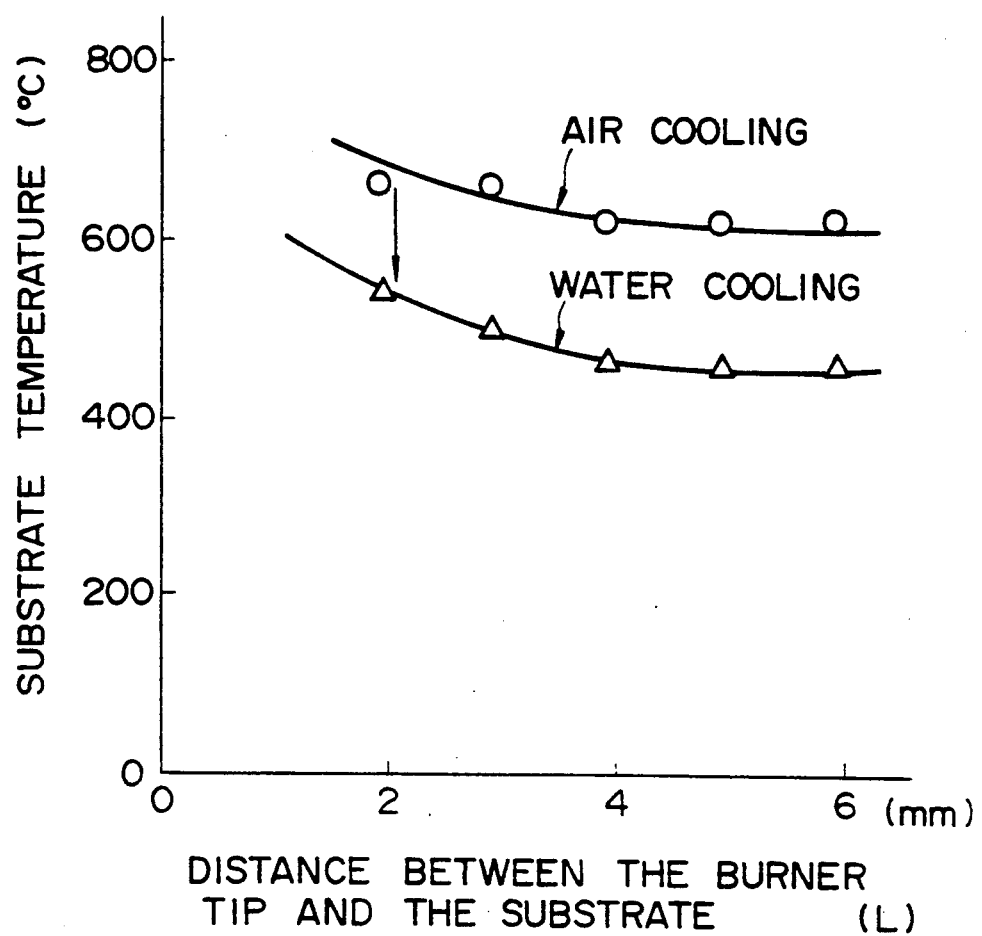
FIG. 8 is a view illustrating the variation in substrate temperature for different types of cooling mediums.
Figure 9:
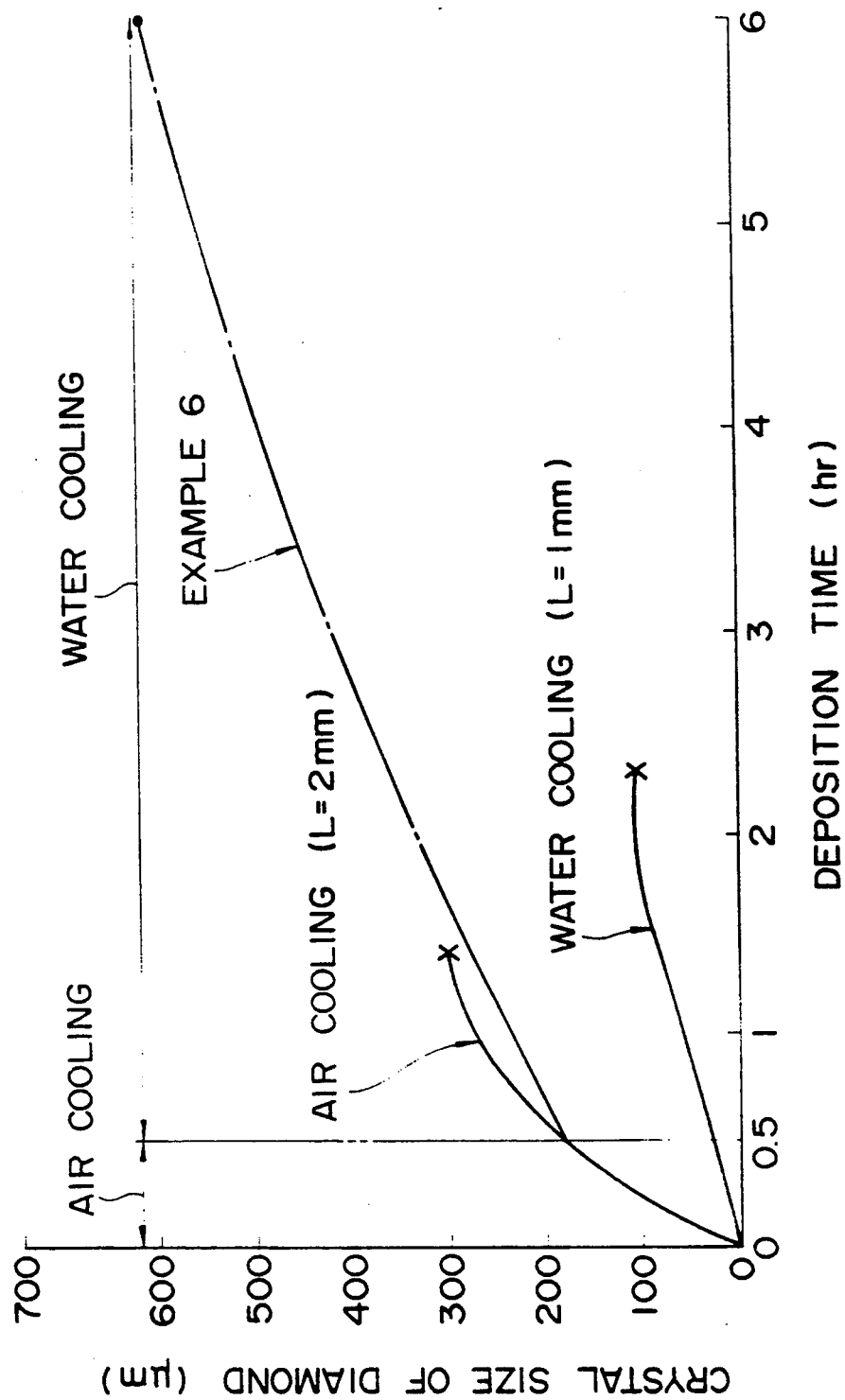
FIG. 9 is a graph showing the relation between the deposition time of diamond and the crystal size in Example 5 and prior art for comparison.
Figure 17:
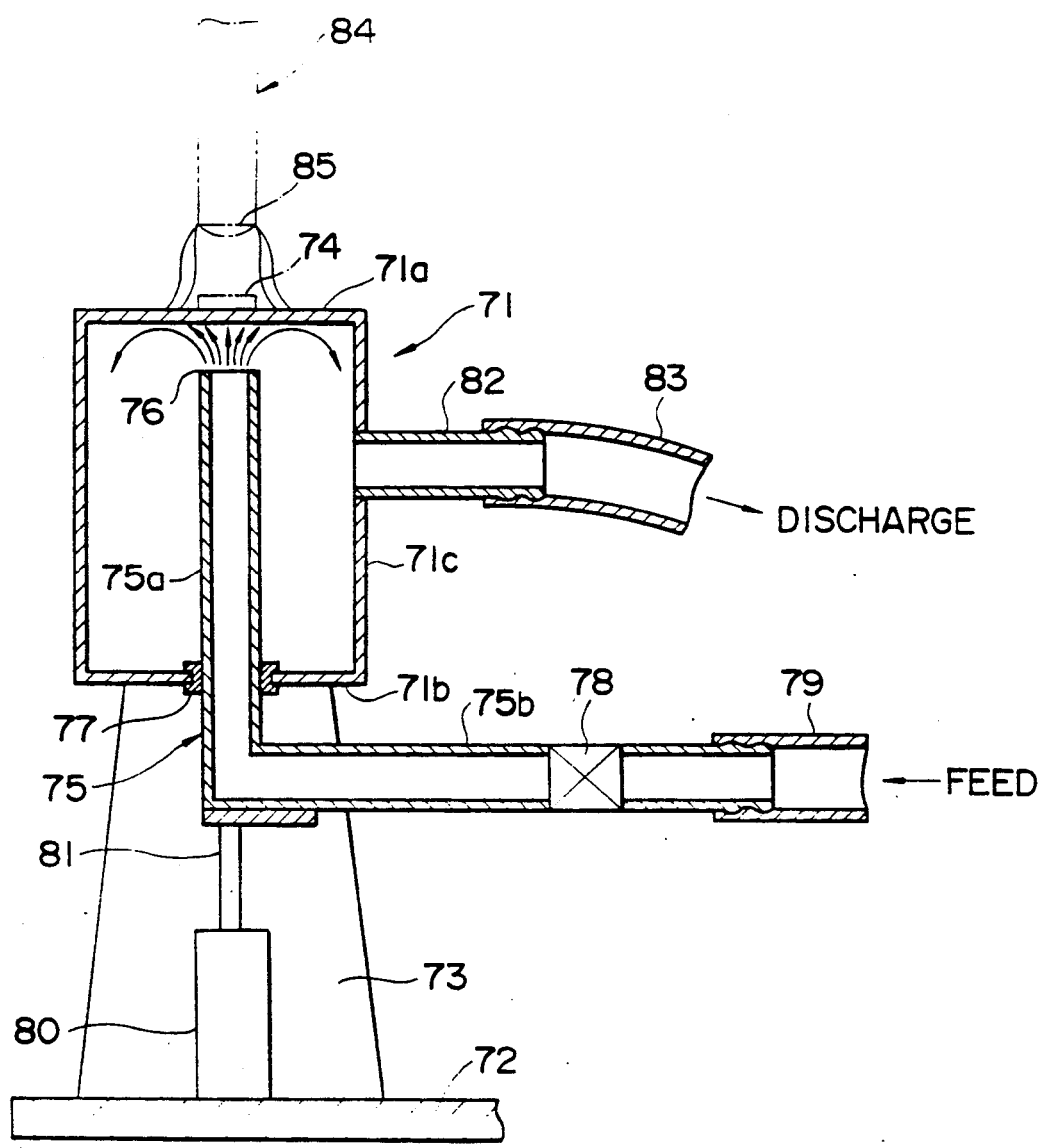
FIG. 17 is a schematic sectional view of a cooling mechanism of a synthesizing apparatus according to one embodiment of the invention.

1 and an arrangement of FIG. 17 wherein the distance, L, between the tip of the burner 1 and the substrate surface was set at 2 mm, and acetylene used as a hydrocarbon fuel gas and pure oxygen used as an oxidizing agent were mixed at a ratio by volume of pure oxygen and acetylene of 0.9 to 1.1:1 and fed at a total flow rate of 0.2 Nm$^3$/hour per unit injection port while cooling under the following conditions. The substrate was cooled by feeding air to the substrate holder 2 for about 30 minutes after commencement of the synthesis, thereby quickly forming a diamond crystal plate. Thereafter, air cooling was changed over to water cooling to increase the cooling ability. The change over of the cooling medium results in a substrate temperature changed from about 700° C. to 550° C. as shown in FIG. 8. The synthesis over 6 hours resulted in diamond having good crystallinity and a size of about 500 μm. The results of Example 6 are shown in FIG. 9 in comparison with the results of FIG. 4.

EXAMPLE 7

Figure 10:
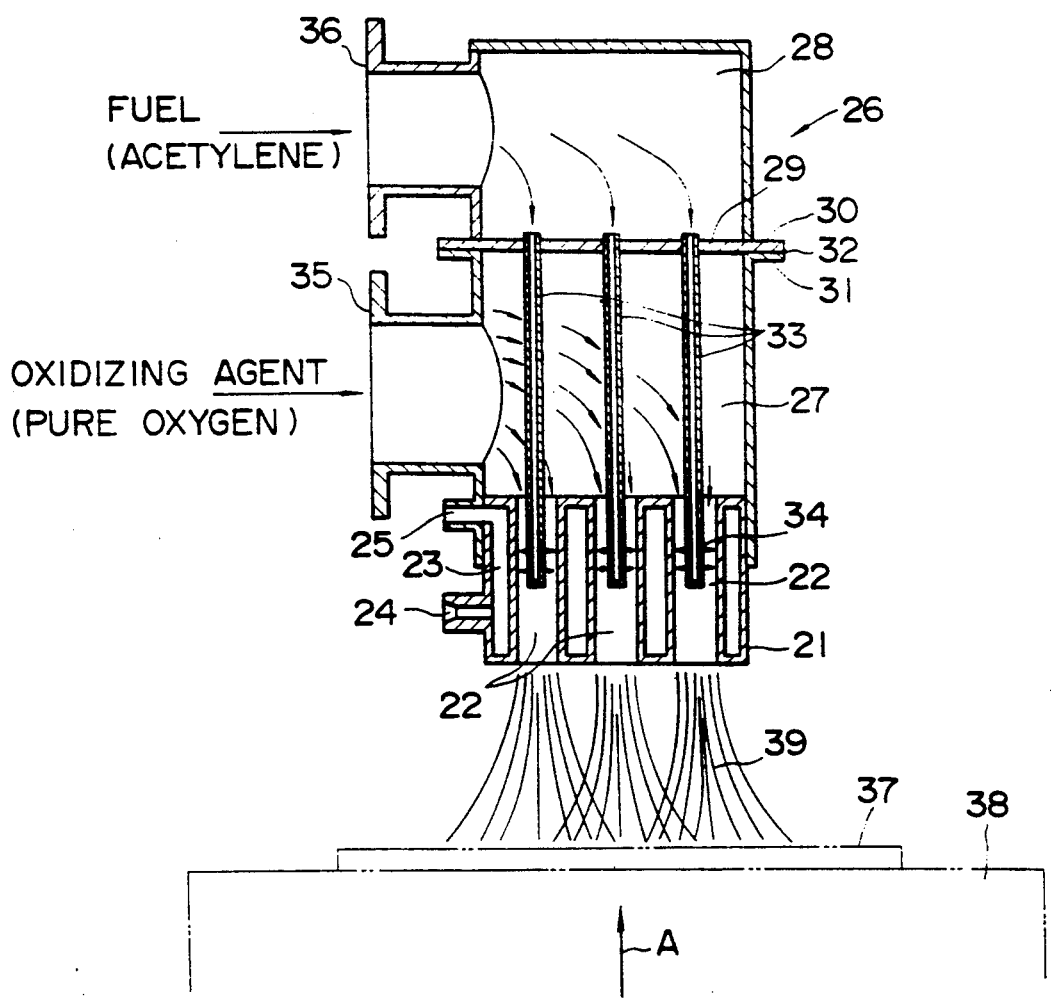
FIG. 10 is an illustrative, sectional view of a burner of a diamond synthesizing apparatus according to one embodiment of the invention.
Figure 11:
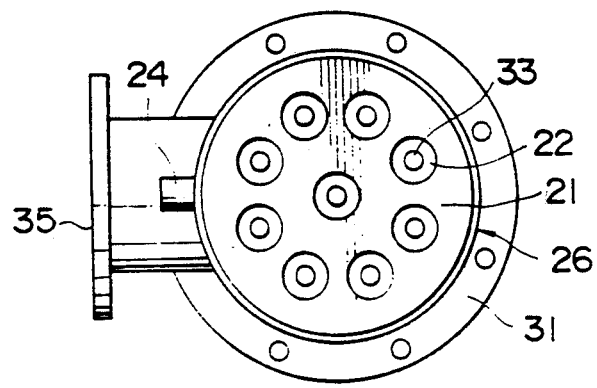
FIG. 11 is an illustrative view as viewed from the arrow A of FIG. 10.

FIG. 10 shows a sectional, illustrative view of a burner body of a diamond synthesizing apparatus according to one embodiment of the invention and FIG. 11 is an illustrative view as viewed from the arrow A of FIG. 10.

In the figures, reference numeral 21 indicates a disk-shaped nozzle portion. The nozzle portion 21 has nine injection portions 22 each having a cooling water passage 23 therearound. Cooling water is charged from a cooling water supply port 24 and discharged from a discharge port 25.

Reference numeral 26 indicates a burner body of a cylindrical form. The burner body 26 includes a lower chamber 27 and an upper chamber 28. The nozzle portion 21 is fixedly attached to a lower end of the lower chamber 27. A partition wall 29 with a diameter larger than the diameter of the burner body 26 is provided between the lower and upper chambers 27, 28 and is fixed to a lower end of the upper chamber 28. The partition wall 29 has a peripheral flange portion 29. The flange portion 29 and a flange 31 formed at an upper peripheral end of the lower chamber 27 are fixed through a packing 32 with a bolt, thereby connecting the lower and upper chambers 27, 28 together.

Nine pipes 33 are passed through and fixed with the partition wall 29 as directed toward the respective injection ports 22 of the nozzle portion 21. Each pipe 33 has a number of small holes 34 made through upper and lower wall portions at the tip thereof.

An oxidizing agent (pure oxygen) introducing connection pipe 35 and a fuel (acetylene) introducing connection pipe 36 are, respectively, provided at the lower and upper chambers 27, 28.

In this instance, the tip portions of the pipes 33 are set within the nozzle portion 21. In the figures, indicated by 37 is a substrate, by 38 is a substrate holder and by 39 is a combustion flame.

The burner body used to synthesize diamond is operated in the following manner.

A pure oxygen feed pipe (not shown) is connected to the connection pipe 35 of the lower chamber 27 and an acetylene feed pipe (not shown) is connected to the connection pipe 36 of the upper chamber. Then, acetylene is fed to the upper chamber 28 under pressure and pure oxygen is fed to the lower chamber under pressure at a mixing ratio which is far smaller than the theoretical mixing ratio. The feed pressure of acetylene is made relatively high and is injected from the small holes 34 of the pipes 33 at a high speed relative to the pure oxygen passing through the injection ports 22, so that both gases are satisfactorily mixed in the injection ports 22. The mixed gas injected from the ports 22 are burnt. At the same time, the substrate 37 is placed in the combustion flame 29 so that the substrate is facing the injection faces of the nozzle portion 21 at a predetermined space. By this, diamond is synthesized over a wide surface of the substrate 37.

EXAMPLE 8

Figure 12:
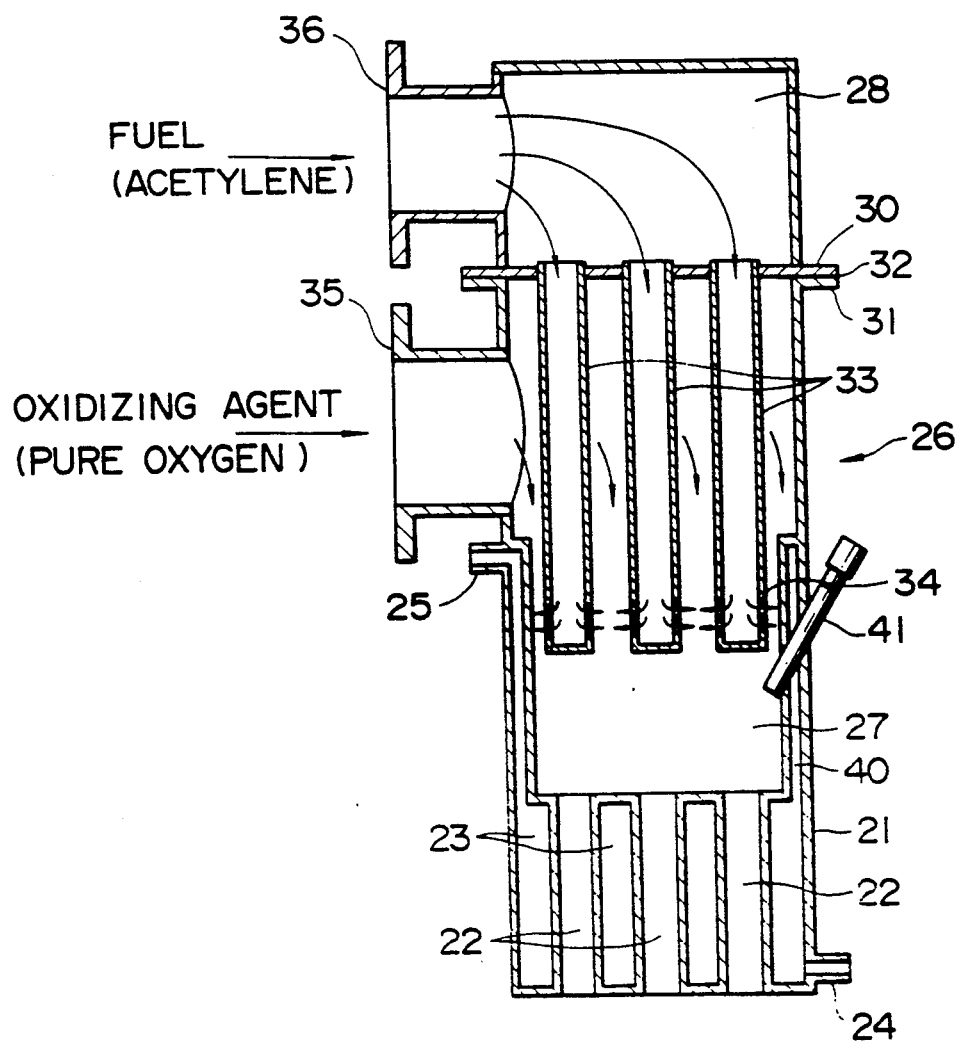
FIG. 12 is an illustrative, sectional view of a burner of a diamond synthesizing apparatus according to another embodiment of the invention.

FIG. 12 is an sectional, illustrative view showing a burner body according to another embodiment of the invention. The burner body shown in this embodiment has fundamentally a similar arrangement as the burner body illustrated in Example 7 except that while the burner of Example 7 includes the pipes 33 provided within the nozzle portion 21 at the tips thereof, the tips of the pipes 33 are disposed at an upper portion of the nozzle portion 21 and the nozzle portion 21 has, at a pipe wall 40 thereof, a thermocouple 41 for detection of back-fire provided between the tip portions of the pipes 33 and the injection ports 22 as directing toward the injection ports 22.

In operation, the burner can be used substantially in the same manner as in Example 7. More particularly, an acetylene feed pipe (not shown) and a pure oxygen feed pipe (not shown) are, respectively, connected to the connection pipe 36 of the upper chamber and the connection pipe 35 of the lower chamber 27. Acetylene is fed to the upper chamber 28 under pressure and pure oxygen is fed to the lower chamber under pressure at a ratio far smaller than the theoretical ratio. The feed pressure of acetylene is made high and is injected from the small holes 34 of the pipes 33 at a high speed relative to the pure oxygen passing from the lower chamber to the injection ports, so that both gases are satisfactorily mixed on the way to the inlet of the injection ports within the lower chamber. Subsequently, the mixed gas injected from the injection ports 22 are burnt, whereupon the substrate 37 is placed in the combustion flame 39 so that it is in face-to-face and spaced relation with the injection face of the nozzle portion 21. By this, diamond is synthesized over a wide area of the substrate 37. In the event that back-fire takes place during the burning, the occurrence is detected in the vicinity of the inlet of the injection ports by means of the thermocouple 41. Accordingly, the back-fire accident would be prevented by controlling the feed, for example, of the fuel and/or the oxidizing agent.

EXAMPLE 9

Figure 13:
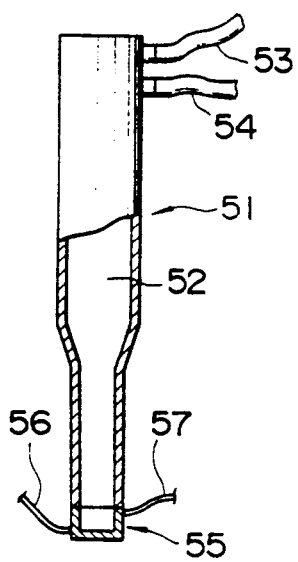
FIG. 13 is an illustrative view, partially in section, of a burner of a diamond synthesizing apparatus according to a further embodiment of the invention.
Figure 14:
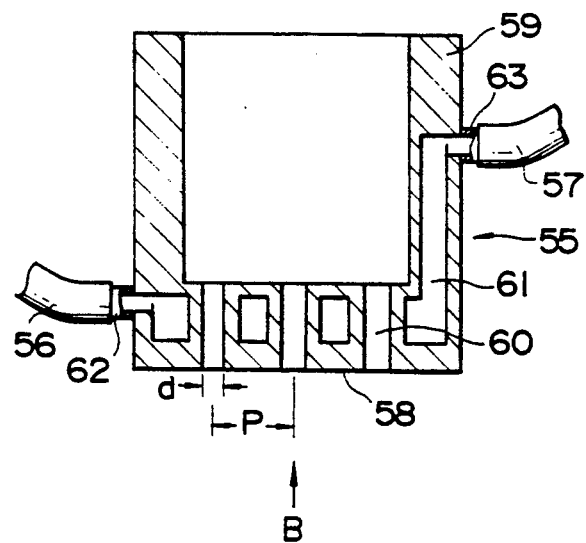
FIG. 14 is an enlarged, sectional, illustrative view of a nozzle portion 55 of FIG. 13.
Figure 15:
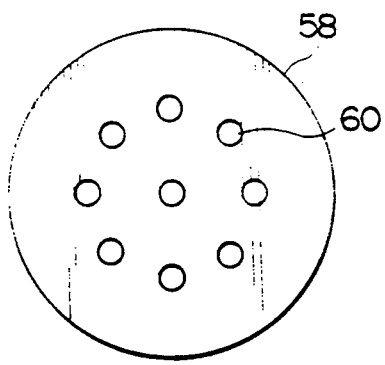
FIG. 15 is an illustrative view as viewed from the arrow of FIG. 14.

FIG. 13 is an illustrative view, partially in section, of a burner body according to a further embodiment of the invention, FIG. 14 is an enlarged sectional illustrative view of the nozzle portion of FIG. 13, and FIG. 15 is an illustrative view as viewed from the arrow B of FIG. 14.

In these figures, a burner body 51 is made of an elongated pipe or tube and includes a pre-mixing chamber 52 at a rear end portion of the body 51, to which a fuel feed pipe 53 and an oxygen feed pipe 54 are connected. The body 51 has a nozzle 55 connected at the tip thereof, to which a water supply pipe 56 and a discharge pipe 57 for cooling water are connected.

The nozzle 55 is made of a nozzle face 58 of a disk form and a a pipe 59 to be attached to the burner body 51. The nozzle face 58 is provided with none injection ports 60, around which cooling water passages 61 are formed. A water supply port 62 and a discharge port 63 are, respectively, connected with the water supply pipe 56 and the discharge pipe 57.

Diamond was synthesized Using the burner body arranged as set forth above, wherein the diameter, d, of the injection ports at the nozzle face 58 was set at 4 mm and the pitch, p, of the injection ports 60 was set at 15 mm. Acetylene and pure oxygen were fed at a ratio by volume of 1.0:1 and burnt to form diamond on the substrate. As a result, diamond was uniformly formed on the substrate over a wide region of about 40 mm in diameter. During the course of the synthesis, any backfire did not take place.

Figure 16:
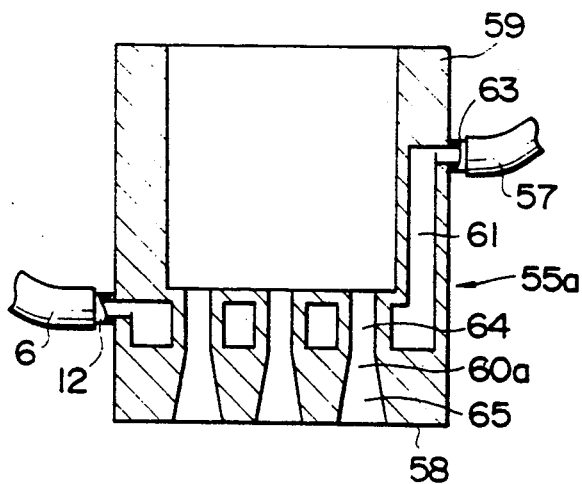
FIG. 16 is an enlarged, sectional, illustrative view of a neighbourhood of a nozzle portion of a burner of a diamond synthesizing apparatus according to a still further embodiment of the invention.

FIG. 16 is an enlarge, sectional, illustrative view of a nozzle portion and its neighbourhood of a burner body according to a still further embodiment of the invention. In the figure, there is shown a nozzle 55a wherein each injection port 60d is formed of a parallel portion 64 and a tapered portion 65 as shown. The diameter, d and the pitch, p, of the parallel portions are formed within the ranges defined in the present invention. The other arrangement is fundamentally the same as the nozzle 55 of FIG. 14.

Using the nozzle 55a, the nozzle is cooled at the parallel portions 64 and back-fire is prevented at the portions. At the tapered portions 65, the flow rate of the injected gas decreases toward the outlet, thereby forming flat feathers. As a result, diamond can be uniformly formed over a wide region.

The setting conditions and arrangement set out above are not limited to the burner bodies shown in FIGS. 13 to 16, but may be applied to the burner body as shown in FIG. 12. More particularly, when the diameter, d, and pitch, p, of the injection ports 22 of the nozzle portion 21 are determined as set forth above, back-fire does not take place and diamond can be uniformly synthesized over a wide region as in Example 9.

EXAMPLE 10

FIG. 17 is a schematic sectional view of a cooling mechanism of the apparatus according to another embodiment of the invention.

In the figure, there is shown a vacant cooling box 71 which is constituted of a copper plate having good thermal conductivity and is mounted on a base 72 by support of the outer bottom with a support plate 73. The cooling box 71 has an upper wall 71a on which a substrate 74 is mounted. The cooling box 71 corresponds to the substrate holder 2 in FIG. 1 or 38 in FIG. 10.

Reference numeral 75 indicates a cooling medium feed pipe in the form of L and includes a vertical portion 75a which is open as 76 at the tip thereof. The opening 76 is in face-to-face relation with an inner surface of the upper wall 71a. The vertical portion 75a is airtightly passed into a through-hole at a lower wall 71b of the cooling box 71 through a sliding ring 77. On the other hand, a horizontal portion 75b of the feed pipe 75 is provided with a flow control valve 78 on the route and connected to a feed pipe (not shown) of a cooling medium through a flexible pipe 79 at a rear end thereof.

Reference numeral 80 is a cylinder fixed to the base 72 and having a rod 81 at which the horizontal pipe 75b of the pipe 75 is fixed.

Reference numeral 82 designates a discharge pipe provided at one side wall 71c of the cooling box 71. The cooling medium which has been fed to the cooling box 71 and heat-exchanged is discharged from a flexible pipe 83 disposed at the tip of the discharge pipe 82.

The synthesis of diamond on the substrate by the combustion technique using the cooling device set forth above is made in the following manner. The substrate 74 is mounted in position on the outer surface of the upper wall 71a of the cooling box 71. A nozzle of a burner 84 for synthesis of diamond is located at a distance of several millimeters from the upper surface of the substrate 74. In this state, a mixed gas is burnt. Thereafter, while the surface temperature of the substrate 74 is measured by means of an indirect thermometer (not shown) such as an optical thermometer, the cylinder 80 is so operated that the temperature of the substrate 74 is in the range of from 300° to 1200° C. This is possible by appropriately controlling the distance between the opening 76 at the tip of the vertical pipe 75a of the feed pipe 754 and the inner surface of the upper wall 71a to adjust the degree of injection of the cooling medium injected from the opening 76 against the inner surface of the upper wall 71a. If necessary, the flow control valve 78 is controlled for controlling the feed of the cooling medium. By this, the temperature of the substrate 74 is invariably, reliably maintained at a level ranging from 300° to 1200° C. In this embodiment the cooling box is illustrated as made of a copper plate as a whole, but only the upper wall 71a may be constituted of a thermally conductive copper plate.

Although one substrate 74 is mounted on the upper wall 71a of the cooling box 71 and one opening 76 of the feed pipe 75 and one combustion burner 84 for synthesis of diamond are correspondingly disposed in the above embodiment, the upper wall 71a of the cooling box 71 may be wide sufficient to dispose a plurality of substrates 74. A corresponding number of openings 76 of the feed pipes and a corresponding number of combustion burners for synthesis of diamond may be provided to arrange the cooling mechanism.

The cooling ability of the cooling mechanism on the substrate may be adjusted, as stated before, by (1) appropriate control of the distance between the opening 76 at the tip of the vertical pipe 75a of the feed pipe 75 and the inner surface of the upper wall 71a by operation of the cylinder 80 to control a degree of injection of the cooling medium from the opening 76 against the inner surface of the upper wall 71a and (2) by adjusting the flow control valve 78a to control the flow of the cooling medium. If it is desired to greatly vary the cooling ability of the cooling mechanism, the controls of (1) and (2) set out above may be insufficient. In the case, the kind of cooling medium is changed on the way of synthesizing diamond in such a way that cooling mediums having higher cooling abilities are properly used with growth of crystals. For instance, as set forth in Example 6, air is employed as the cooling medium at an initial stage of synthesis, after which water having greater cooling ability is used as the cooling medium. It will be noted that when the cooling medium is changed over from one to another, the controls of (1) and (2) above may be simultaneously made.

EXAMPLE 11

In this embodiment, the same cooling mechanism as stated in Example 10 is used except that thermocouples 86, 87 which are sensors of thermometers are embedded in the upper wall 71a of the cooling box 71. In the following, like reference numerals as in Example 10 indicate like parts.

Figure 18:
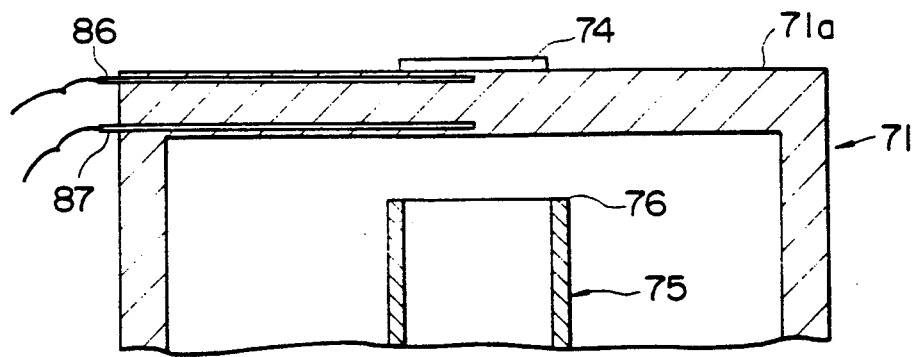
FIG. 18 is an illustrative view of an essential part of a cooling mechanism according to the invention.

A thermocouple 86 is embedded so that its tip portion is positioned at the center of the upper wall 71a at the upper side and a thermocouple 87 is embedded so that its tip portion is positioned at the center of the upper wall 71a at the inner side thereof. A temperature gradient calculated from the temperatures measured by means of the two thermocouples 86, 87 is used to calculate the surface temperature of the upper wall 71a and also the temperature of the substrate 74. It will be noted that in FIG. 18, the thermocouples are employed as a sensor but other sensing devices may be used, if desired.

In operation, the substrate 74 is placed in position on the outer surface of the upper wall 71a of the cooling box 71 and the nozzle 85 of the burner 84 is provided at a distance of several millimeters from the substrate 74, followed by combustion. Then, while the surface temperature of the substrate 74 is measured by means of the two thermocouples 86, 87 embedded in the upper wall 71a, the apparatus is so controlled that the temperature of the substrate 74 is within a predetermined range of from 300° to 1200° C. By this, the temperature of the substrate is reliably maintained within a range of from 300° to 1200° C. during the course of synthesis of the substrate. Thus, diamond of a good quality and/or a large size can be obtained.

EXAMPLE 12

Figure 19:
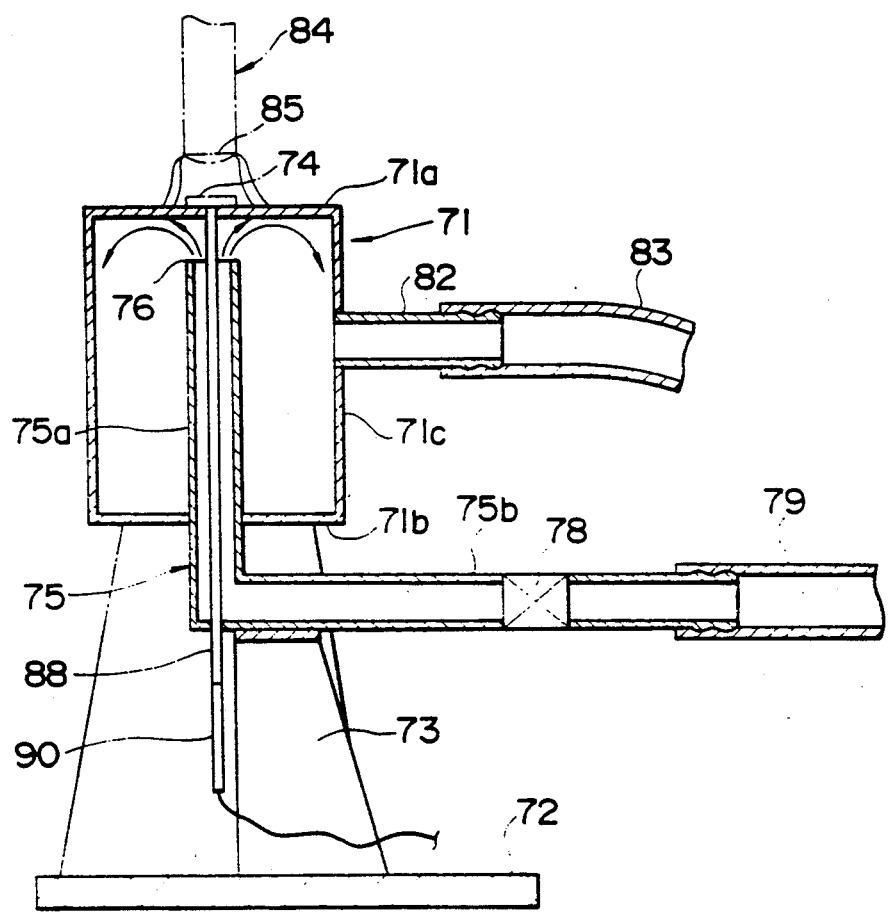
FIG. 19 is a schematic sectional view of a cooling mechanism of a synthesizing apparatus according to another embodiment of the invention.

FIG. 19 is a schematic sectional view of a cooling mechanism of the apparatus according to a further embodiment of the invention, wherein like reference numerals as in Example 10 indicate like parts only for convenience' sake.

In this embodiment, a fine tube is provided so as to disposed a thermocouple 90 used as a sensor for measuring the temperature of the substrate 74. This fine tube is passed through the central portion of the vertical pipe 75a of the feed pipe 75 and its tip is tightly inserted into a through-hole made at the upper wall 71a of the cooling box 71 corresponding to the center of the substrate 74.

The synthesis of diamond on the substrate using the above cooling device is performed in the same manner as in Example 11. This arrangement ensures a temperature of the substrate 74 within a range of from 300° to 1200° C. invariably during the course of the synthesis, thereby obtaining diamond with a good quality and/or a large size. In FIG. 19, the vertical pipe 75a is fixed. The fine tube 88 and the vertical pipe 85a are slidably contacted under airtight conditions and the fine tube 75 may be removably disposed in a groove as shown in FIG. 17.

What is claimed is:

1. A process for synthesizing diamond by a combustion technique which consists essentially of the steps of:
   mixing a hydrocarbon fuel gas and oxygen to form a mixed gas,
   burning the mixed gas with a burner to form a flame,
   contacting the resulting flame with a surface of a substrate provided in face-to-face relation with the burner,
   cooling the substrate to synthesize diamond, and
   controlling diamond-synthesizing conditions on the surface of the substrate so as to synthesize diamond at a lowered growth rate as time passes after commencement of the contacting step.

2. The process according to claim 1, wherein the controlling step comprises increasing the distance between the burner tip and the substrate as time passes after commencement of the contacting step.

3. The process according to claim 1, wherein the controlling step comprises increasing the ratio by volume of oxygen to hydrocarbon fuel gas as time passes after commencement of the contacting step.

4. The process according to claim 1, wherein the controlling step comprises lowering the temperature of a crystal surface of synthesized diamond as time passes after commencement of the contacting step.

5. The process according to claim 4, wherein the lowering of the temperature of the crystal surface of synthesized diamond is effected by adding an inert gas to the mixed gas as time passes after commencement of the contacting step.

6. The process according to claim 4, wherein the lowering of the temperature of the crystal surface of synthesized diamond is effected by increasing cooling of the substrate as time passes after commencement of the contacting step.

7. The process according to claim 1, wherein said controlling step comprises intermittently changing said diamond-synthesizing conditions on the surface of the substrate so as to synthesize diamond at a lowered growth rate as time passes after commencement of the contacting step.

8. The process according to claim 1, wherein said controlling step comprises continuously changing said diamond-synthesizing conditions on the surface of the substrate so as to synthesize diamond at a lowered growth rate as time passes after commencement of the contracting step.

* * * * *